United States Patent [19]

Saito et al.

[11] Patent Number: 5,104,694
[45] Date of Patent: Apr. 14, 1992

[54] SELECTIVE CHEMICAL VAPOR DEPOSITION OF A METALLIC FILM ON THE SILICON SURFACE

[75] Inventors: Kunio Saito; Yoshinobu Arita; Takao Amazawa, all of Kanagawa, Japan

[73] Assignee: Nippon Telephone & Telegraph Corporation

[21] Appl. No.: 509,873

[22] Filed: Apr. 16, 1990

[30] Foreign Application Priority Data

Apr. 21, 1989 [JP] Japan .................. 1-100078
Aug. 14, 1989 [JP] Japan .................. 1-207829

[51] Int. Cl.$^5$ .................. C23C 16/00; B05D 3/04
[52] U.S. Cl. .................. 427/255; 427/309;
427/250; 427/253; 427/126.1; 427/126.2;
427/55; 427/53.1; 427/314; 427/255.2;
427/255.1
[58] Field of Search .................. 427/255, 314, 55, 53.1,
427/250, 255.1, 255.2, 248.1, 126.1, 126.2, 309,
307, 253; 156/646, 643

[56] References Cited

U.S. PATENT DOCUMENTS

| | | | |
|---|---|---|---|
| 4,629,635 | 12/1986 | Brors | 427/255.2 |
| 4,647,494 | 3/1987 | Meyerson et al. | 428/216 |
| 4,668,530 | 5/1987 | Reif et al. | 427/55 |
| 4,956,204 | 9/1990 | Amazawa et al. | 427/248.1 |

FOREIGN PATENT DOCUMENTS 59-112611  6/1984  Japan .

OTHER PUBLICATIONS

Ilderem et al., "Very Low Pressure Chemical Vapor Deposition Process for Selective Titanium Silicide Films", *App. Phys. Lett.* 53 (8), 22 Aug. 1988, 1988 American Institute of Physics, pp. 687-689.

Junichi Murota et al., "Low-Temperature Silicon Selective Deposition and Epitaxy on Silicon Using the Thermal Decomposition of Silane Under Ultraclean Environment", *Appl. Phys. Lett.* 54 (11), 13 Mar. 1989, 1989 American Institute of Physics, pp. 1007-1009.

Bouteville et al., "LPCVD of Titanium Disilicide", *J. Electrochem. Soc.:* Solid-State Science and Technology, Aug. 1987, pp. 2080-2083.

Ilderem et al., "Optimised Deposition Parameters for Low Pressure Chemical Vapor Deposited Titanium Silicide", *J. Electrochem. Soc.:* Solid-State Science and Technology, Oct. 1988, pp. 2590-2596.

Kunio Saito et al., "Effect of Silicon Surface Cleaning on the Initial Stage of Selective Titanium Silicide Chemical Vapor Deposition", *Japanese Journal of Applied Physics*, vol. 29, No. 1, Jan., 1990, pp. L185-L187.

*Primary Examiner*—Shrive Beck
*Assistant Examiner*—Roy V. King
*Attorney, Agent, or Firm*—Blakely, Sokoloff, Taylor & Zafman

[57] ABSTRACT

A selected chemical vapor deposition method includes the steps of arranging a substrate having a silicon surface and an insulator surface in a reaction chamber, supplying a gas consisting of a silicon hydride in said reaction chamber to reduce and remove a native oxide film on said silicon surface by said gas, and supplying a source gas in said reaction chamber to selectively form a film on only said silicon surface.

8 Claims, 6 Drawing Sheets

SELECTIVE CHEMICAL VAPOR DEPOSITION OF A METALLIC FILM ON THE SILICON SURFACE

BACKGROUND OF THE INVENTION

The present invention relates to a selective chemical vapor deposition method and a CVD apparatus using the same.

In manufacturing a semiconductor device using a silicon substrate, in order to reduce a contact resistance of an ohmic contact between a wiring metal and a silicon layer doped with an impurity at a high concentration or to suppress a solid phase reaction between the wiring metal and silicon, a method of forming a silicide film between the wiring metal and the silicon layer is attempted. In addition, in order to reduce a sheet resistance of the high-concentration silicon layer, a method of forming a silicide film on the high-concentration silicon layer is attempted. A titanium silicide film having a low resistance is suitable as the silicide film for these purposes.

Examples of a conventional method of forming a silicide film on the surface of silicon are a method in which a silicide film is deposited by sputtering using a silicide target and a method in which a metal film is deposited on the surface of silicon by sputtering using a metal target and the metal and silicon are reacted by annealing to form a silicide film. These sputtering methods, however, have poor step coverage. Therefore, when a pattern size is decreased, a film cannot be uniformly deposited in, e.g., a contact hole. For this reason, instead of the sputtering method, a demand has arisen for a film formation method capable of forming a metal film with good step coverage.

In a CVD (Chemical Vapor Deposition) method, since a source gas is decomposed on the surface of a heated material, a film can be uniformly deposited on even the bottom of a contact hole. As such a CVD method, a blanket CVD method in which a film is uniformly deposited on the entire surface of a substrate is generally used. In recent years, however, a selective CVD method in which a film is deposited on only the surface of a specific material has been developed for several kinds of materials. This selective CVD method can be optimally used to form a titanium silicide film on the surface of a high-concentration silicon layer.

Selective titanium silicide film CVD methods has been reported by Bouteville et al. (Journal of Electrochemical Society: SOLID-STATE SCIENCE AND TECHNOLOGY. Vol. 134, No. 8, (1987) 2080) and Ilderem et al. (Applied Physics Letters, Vol. 53, No. 8, (1988) 688). According to the method reported by Bouteville et al., however, since hydrogen ($H_2$) gas and titanium tetrachloride ($TiCl_4$) gas are used as source gases and silicon for titanium silicide is supplied from silicon of a substrate, a titanium silicide film largely consumes the silicon substrate. In addition, this method poses a problem in which a film growth starts with islets, i.e., a problem of so-called significant nucleation. On the other hand, according to the method reported by Ilderem et al., a titanium silicide film is not directly selectively deposited on the surface of silicon, but a polysilicon film is deposited on the entire surface prior to deposition of the titanium silicide film, and then the titanium silicide film is deposited. Polysilicon on an insulating film is etched and removed during deposition of the titanium silicide film. By using this method, although they obtained a thin titanium silicide film having a smooth surface, full selectivity was not obtained but polysilicon or titanium silicide remained on the insulating film. They used $TiCl_4$ gas and silane ($SiH_4$) gas as source gases but could not reduce consumption of underlying silicon. According to a similar experiment using the method of Iderem et al. conducted by the present inventors, when a deposition time of a titanium silicide film was prolonged in order to reduce remainder on an insulating film, the titanium silicide film deposited on silicon largely consumes underlying silicon. As a result, the consumption amount became 100% or more the thickness of the titanium silicide film.

Since the selective CVD method obtains the selectivity by a difference between surface properties, film deposition condition is largely affected by the state of the surface of a material for film deposition (a semiconductor or conductor). That is, if cleanness of the surface is poor, properties of selective deposition adversely affect to result in a problem in which no film is deposited, nuclei are deposited only coarsely, or a film having large undulations is deposited. Therefore, it is difficult to deposit a uniform film. Especially when the surface for film deposition is silicon, a native oxide film is immediately grew on the silicon surface if silicon is exposed to an atmosphere containing oxygen or moisture. Therefore, it is difficult to deposit a film with high uniformity and selectivity.

That is, even if a substrate having a silicon surface is dipped in a dilute hydrofluoric acid to remove a native oxide film on the surface and immediately loaded in a CVD apparatus and vacuuming or air substitution is performed, oxidation of the silicon surface cannot be prevented. In addition, even if removal of the oxide film from the silicon surface is performed so that the silicon surface is not exposed to air, the silicon surface is oxidized by a small amount of moisture or oxygen in vacuum or a gas.

Not so many experiments have been conducted for the titanium silicide film CVD method. One reason for this is that no suitable CVD apparatus for this purpose has been developed. In titanium silicide film CVD, $TiCl_4$ gas can be most conveniently used as a source gas. In order to deposit a titanium silicide film having a low resistance on silicon by using the $TiCl_4$ gas, however, a silicon substrate must be heated up to a high temperature of 650° C. or more. In addition, a cold wall type apparatus must be used to obtain good selectivity. Furthermore, in order to eliminate a vapor phase reaction and to obtain a proper deposition rate, the pressure of a source gas must be reduced to a low pressure at which the flow of gas becomes a molecular flow.

Since the titanium silicide film is a metal film, an induction furnace or the like cannot be used to heat a substrate. In addition, since the titanium silicide film does not transmit but absorbs light, a method of simple lamp heating or the like cannot be used. Chlorine or a chloride produced upon decomposition of the $TiCl_4$ gas is a corrosive gas and therefore corrodes a metal or the like. These problems prevent development of an apparatus capable of performing CVD of a titanium silicide film.

The following apparatus can be exemplified as a conventional metal film CVD apparatus. This CVD apparatus is developed mainly for selective CVD of tungsten (W).

In order to perform CVD by heating a wafer temperature up to 400° C. in the conventional cold wall type single wafer processing apparatus, therefore, a CVD method capable of preventing blur on a window which is a drawback of the conventional lamp heating type CVD apparatus is proposed (Japanese Patent Laid-Open No. 63-26366). As shown in FIG. 9, when a wafer 11 held by a susceptor 17 arranged in a reaction chamber 10 is heated by a lamp heater 13 through a window 12 and a source gas 14 is supplied to form a film on the surface of the wafer 11, a purge gas is supplied from a purge gas supply portion 15 provided between the window 12 and the wafer 11 to form a purge gas flow 16. The purge gas flow 16 covers the surface of the purge gas supply portion 15 so that the source gas does not contact the surface of the purge gas supply portion 15 or the window 12, thereby preventing blur on the surface. According to this CVD apparatus and method, a wafer can be heated up to a high temperature in the presence of a source gas to perform CVD with comparatively high reproducibility even by using an apparatus of a cold wall type.

The above CVD method of preventing blur on a window by using a purge gas flow, however, can be used in only a comparatively high pressure region of a gas (source gas+purge gas) in a reaction chamber, in which a gas flow becomes a viscous flow. In a low gas pressure region in which the gas flow becomes a molecular flow, since the source and purge gases are instantaneously mixed with each other, the source gas contacts the surface of the purge gas supply portion 15 or the window 12. Therefore, the surface cannot be protected from being blurred.

Even in a viscous flow region, if a gas having a high adhesion property is contained in the source gas, the purge gas supply portion 15 or the window 12 is gradually blurred by entrance of a small amount of highly adhesive gas. This is because the pressures of the purge and source gases become equal to each other in such a CVD apparatus due to the structure of the apparatus and therefore the purge gas has only a weak effect of preventing entrance of the source gas.

The conventional single wafer processing CVD apparatus, however, cannot manufacture a high-quality thin film with high reproducibility by performing CVD by using a chlorine-based source gas having a high adhesion property and by heating a substrate up to 500° C. or more in a pressure region in which a gas flow becomes a molecular flow. In particular, since film quality of a thin metal film is easily adversely affected by an impurity or crystallinity, it is difficult to stably manufacture, with high reproducibility, a high-quality thin metal film having a composition or a resistance close to that of a bulk by depositing the film from a chlorine-based source gas.

SUMMARY OF THE INVENTION

It is, therefore, a principal object of the present invention to provide a selective CVD method capable of forming a metal film on a silicon surface with high uniformity and selectivity.

It is another object of the present invention to provide a selective CVD method capable of reducing a contact resistance between silicon and a wiring metal.

It is still another object of the present invention to provide a selective CVD method capable of forming a uniform metal film on the bottom of a contact hole having a large aspect ratio.

It is still another object of the present invention to provide a CVD apparatus for selective CVD capable of manufacturing a high-quality film with high reproducibility.

It is still another object of the present invention to provide a CVD apparatus capable of repeatedly manufacturing films having the same film quality under the same deposition conditions.

The above objects are achieved by the present inventors on the basis of the finding that the density of deposition nuclei in a film deposition initial stage is reduced even by slight oxidation on an Si surface to degrade the uniformity or shape of a deposited film.

According to the principle of the present invention, a substrate is heated and its Si surface is exposed to a gas consisting of silicon hydride to reduce and remove a native oxide film from the Si surface, and a source gas is supplied to a reaction chamber to selectively deposit a film on the Si surface. In this method, since the native oxide film on the Si surface is reduced and removed when the temperature of the Si surface is increased up to several hundreds of degrees in centigrade, a clean Si surface can be obtained. By supplying the source gas into the reaction chamber in this state, the density of nuclei deposited on the Si surface in an initial stage of film deposition can be increased. Therefore, a film can be uniformly deposited. In addition, since a clean Si surface can be obtained, high selectivity can be obtained with respect to an insulator upon film deposition.

According to the present invention, there is provided a CVD apparatus which forms a film on a wafer placed in a reaction chamber by using a chemical reaction in a vapor phase, comprising a wafer susceptor, having a wafer contact portion consisting of at least quartz glass and holding a wafer such that the contact portion contacts only a peripheral portion of the wafer, for dividing the reaction chamber in two regions, a purge gas supply mechanism connected to a first region at a wafer heating side of the reaction chamber divided by the susceptor, source gas supply and exhaust mechanisms connected to a second region at a side opposite to the wafer heating side of the divided reaction chamber, and a heating mechanism, provided in the first region or outside the reaction chamber at the first region side, for heating the wafer, wherein a gap defined between the first and second regions divided by the wafer susceptor is minimized, and radiant light generated by a heat generating member of the heating mechanism can be directly absorbed by the wafer.

According to the present invention, by using the above CVD apparatus, a purge gas is supplied to the first region while the wafer is heated so that the pressure of the purge gas becomes higher than that of a source gas, and a gas containing chlorine is supplied as a source gas to the second region, thereby forming a film on the wafer while the pressure of the source gas is so maintained as to form a molecular flow.

In the CVD apparatus of the present invention, therefore, the wafer susceptor divides the reaction chamber into two regions, and the gap defined between the divided first and second regions is minimized. Therefore, even if the pressure of the source gas is so maintained as to form a molecular flow, entrance of the source gas to the first region can be prevented. Since the purge gas having a higher pressure than that of the source gas can be filled in the first region, an effect of preventing entrance of the source gas can be improved. In addition, since the wafer contact portion of the susceptor consists of quartz glass and therefore has a small thermal expansion coefficient, this portion is less deformed even when the wafer and a surrounding portion of the wafer are heated up to a high temperature. Therefore, since no large gap is formed in this portion, entrance of the source gas to the first region can be prevented. In this manner, even if a chlorine-based gas having a high adhesion property is used as the source gas, entrance of the gas to the first region can be prevented. Furthermore, quartz glass as a material of the susceptor has a high resistance to chlorine.

DETAILED DESCRIPTION OF THE PREFERRED EMBODIMENTS

Embodiments of the present invention will be described below with reference to accompanying drawings.

Figure 1:
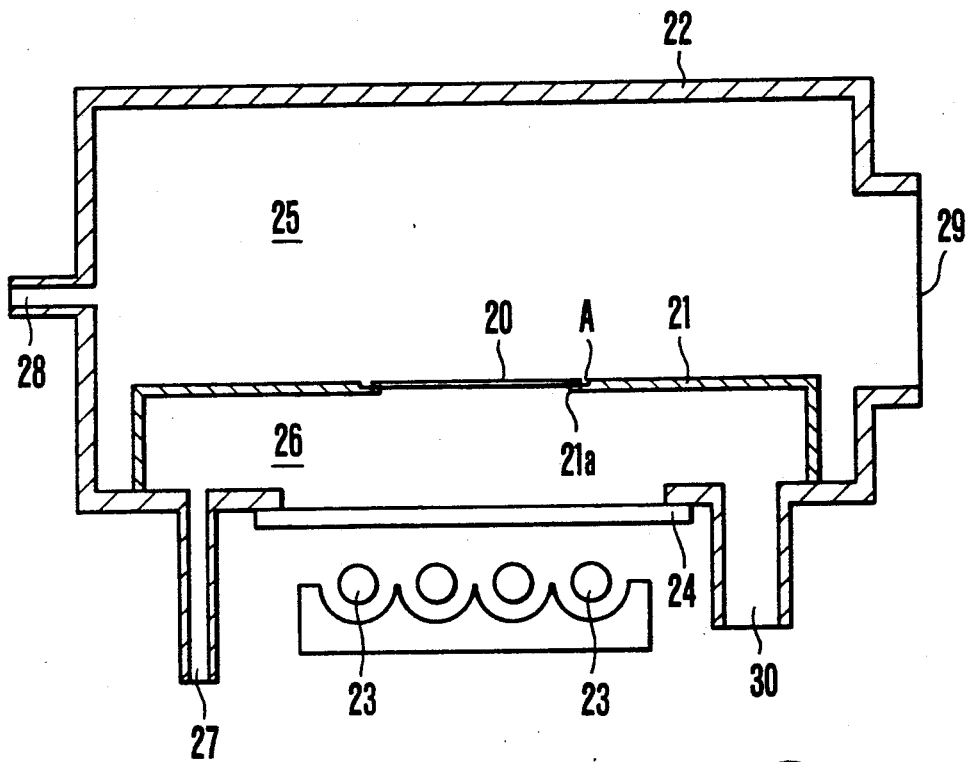
FIG. 1 is a sectional view showing a basic arrangement of an embodiment of a CVD apparatus to which a selective CVD method according to the present invention is applied.

FIG. 1 shows a cold wall type CVD apparatus according to an embodiment of the present invention. Referring to FIG. 1, a peripheral portion of a wafer 20 is held by a wafer susceptor (to be referred to as a susceptor hereinafter) 21 consisting of an insulating material, and its lower surface is heated by light generated by a lamp heater (heating member) 23 located outside a cylindrical metal reaction chamber 22 through a window 24. The interior of the reaction chamber 22 is divided into two regions 25 and 26 by the wafer 20, the susceptor 21, and the like (in this embodiment, the chamber is divided along its axial direction). One region 26 is filled with a purge gas supplied from a purge gas supply port 27 formed in a circumferential wall of the cylindrical reaction chamber 22. The other region 25 is filled with a source gas supplied from a source gas supply port 28 formed in one end portion in the axial direction of the reaction chamber 22. When the source gas contacts the surface of the wafer 20 exposed to the region 25 side, a film is deposited on the surface of the wafer 20. The source gas, a reaction gas produced upon deposition of the film, and the purge gas leaking from a gap formed in an overlapped portion of the wafer and the susceptor 21 to the region 25 side are exhausted from an exhaust port 29. A purge gas exhaust port 30 formed on the upstream side of the purge gas in the region 26 is used to exhaust the source gas entering into the region 26 together with the purge gas to maintain cleanness in the region 26. The exhaust port 30 is also used to maintain the pressure of the purge gas constant. If, however, an amount of supply source gas is small and negligible or the pressure of the purge can be maintained constant without the purge gas exhaust port, the purge gas exhaust port need not be formed.

In the CVD apparatus of this embodiment, the reaction chamber 22 is divided into the regions 25 and 26 by the wafer 20 and the susceptor 21 to prevent the source gas from entering into the region 26, thereby preventing blur on the surface of the window 24. In order to minimize an amount of source gas entering into the region 26, a gap formed in the overlapped portion of the wafer 20 and the susceptor 21 and a gap formed between the susceptor 21 and an inner wall of the reaction chamber 22 must be minimized. Of the two gaps, the gap between the susceptor 21 and the inner wall of the reaction chamber 22 can be comparatively easily minimized since these portions are not directly heated and therefore the temperatures of the portions are not increased. That is, mechanical precision of these portions need only be improved. The overlapped portion of the wafer 20 and the susceptor 21, however, is heated up to a high temperature by light from the lamp heater 23 or heat from the wafer 20. Therefore, a large gap is easily formed due to thermal deformation of the susceptor 21.

In this embodiment, therefore, processed quartz glass is used as a material of the susceptor 21. An ultrasonic processing method is suitable for processing quartz glass with high precision. When quartz glass is used as the material of the susceptor 21, since the thermal expansion coefficient of quartz glass is very small (about 0.3 ppm), almost no deformation occurs in the susceptor 21 even if a portion in contact with the wafer 20 is heated up to a high temperature while the remaining portion is kept at a low temperature. Therefore, no large gap is formed in the overlapped portion of the wafer 20 and the susceptor 21. If, however, the susceptor 21 is made of a metal, since the thermal expansion coefficient of a metal is large (several ppm to several tens of ppm), a portion of the susceptor heated up to a high temperature expands and is deformed to form a large gap in the overlapped portion of the wafer and the susceptor.

When the susceptor 21 is formed of quartz glass, a conductance of the gap formed in the overlapped portion of the wafer 20 and the susceptor 21 is as follows. This experiment was conducted under the conditions that the purge gas exhaust port 30 was closed, a 0.5-mm thick Si wafer having a diameter of 4 inches was used as the wafer 20, a peripheral portion having a width of 5 mm of the wafer was overlapped, and the thickness of the susceptor 21 was set to be 5 mm. When Ar gas was supplied at a flow rate of 0.01 SCCM from the purge gas supply port 27 and exhausted from the exhaust port 29 by a pump having a capacity of 1,000 l/sec, the pressure of the ar gas in the region 26 was about 0.1 Torr, and that in the region 25 was about $2 \times 10^{-5}$ Torr. That is, the conductance of the gap in the overlapped portion of the wafer 20 and the susceptor 21 was as very small as about 1.3 cc/sec or less. The conductance of the gap changes in accordance with a mechanical precision of the susceptor or the like. In this experiment, however, the susceptor or the like was processed by a normal processing method, i.e., no special highly precise processing is required. When the wafer 20 is heated, the Ar gas in the region 26 is heated and the pressure of the gas is slightly increased accordingly. The pressure of Ar in the region 25, however, substantially remains unchanged. This tendency does not change even when the temperature of the wafer 20 is increased up to about 800° C. This indicates that the gap (conductance) in the overlapped portion of the wafer 20 and the susceptor 21 is not increased even when the wafer 20 is heated up to a high temperature. If, however, a metal such as 5-mm thick titanium is used as the material of the susceptor 21, the pressure in the region 26 is reduced as the temperatures of the wafer and the susceptor are increased. This indicates that the gap in the overlapped portion is widened due to thermal strain of the metal susceptor. When processing strain of a metal is released due to thermal deformation, the metal sometimes cannot restore its original shape. This deformation conspicuously occurs as the plate thickness of a metal is decreased.

As shown in FIG. 1, a hole 21a having a flange A capable of holding the wafer 20 is formed in the susceptor 21 so as to contact only the peripheral portion of the wafer 20. This structure is adopted for the following reason. Since the source gas flows to the overlapped portion of the wafer 20 and the susceptor 21, a film is deposited on the surface of the overlapped portion of the susceptor 21. If the deposited film is opaque with respect to radiation light from the heater, heat is absorbed by the film, and the temperature of the wafer placed on this portion is reduced. In the CVD apparatus according to this embodiment, therefore, in order to minimize the area of the overlapped portion of the wafer 20 and the susceptor 21 and to minimize the gap defined between the two regions 25 and 26, only the peripheral portion of the wafer 20 contacts the susceptor.

Figure 2:
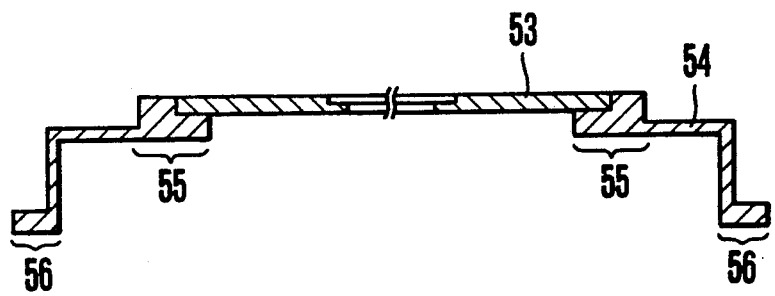
FIG. 2 is a sectional view showing a modification of a wafer susceptor shown in FIG. 1.

The structure of the susceptor 21 is not limited to that shown in FIG. 1. As shown in FIG. 2, for example, the structure may be modified such that a quartz glass portion 53 is used in only a portion to be heated up to a high temperature and a metal portion 54 is used in a portion not to be heated up to a high temperature. Processing using a lathe is suitable for a contact portion 55 with respect to the quartz glass portion 53 or a contact portion 56 with respect to a reaction chamber wall since these portions required high surface precision. The metal portion 51 may be cooled with water in order to suppress thermal expansion.

Figure 4:
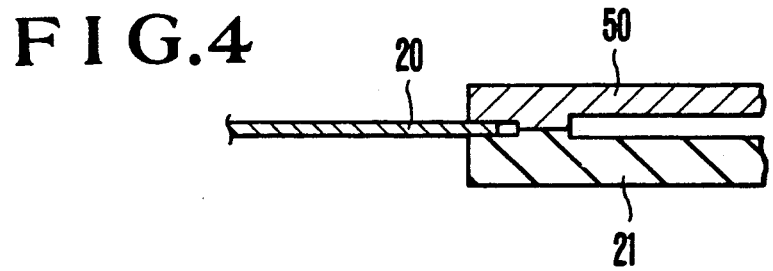
FIG. 4 is a sectional view showing another modification of the wafer susceptor.

When the source gas is to be supplied to the region 25 to perform CVD, in order to prevent blur on the surface of the window 24 formed in the circumferential wall at the region 26 side of the reaction chamber 22, the pressure of the purge gas in the region 26 is increased to be higher than that of the source gas in the region 25. Although entrance of the source gas into the region 26 can be prevented more effectively as the pressure difference is increased, the pressure difference normally need only be about 0.1 Torr. If the pressure of the purge gas is increased too much, the wafer 20 is floated by this pressure. As shown in FIG. 4, in order to increase the pressure of the purge gas, a wafer older 50 may be used to hold the peripheral portion of the wafer 20 placed on the susceptor 21 so that the wafer 20 is not floated.

Furthermore, there are three pressure levels at work here. Specifically: (1) a first pressure at which a residual gas is exhausted; (2) a second pressure at which silane and disilane gases are supplied; and (3) a third pressure at which a source gas is supplied. In a preferred embodiment, these pressures correspond to: (1) pressure under normal condition equaling, for example, $10^{-6}$ Torr or less; (2) pressure equaling, for example, 0.1-10 mTorr; and (3) pressures that could be either higher or lower than that of the silane and disilane gases at the time the source gas is supplied.

Another advantage obtained when the susceptor 21 consists of quartz glass will be described below. As will be described later, in the CVD method using the above CVD apparatus as another aspect of the present invention, titanium tetrachloride ($TiCl_4$) gas is used as the source gas. In a reaction upon film formation, $TiCl_4$ is decomposed to produce chlorine ($Cl_2$) or hydrogen chloride (HCl). $Cl_2$ or HCl has high corrosiveness and is used as an etching gas for etching, e.g., Si. $SiO_2$, however, has a high resistance to such a chlorine-based gas. Quartz glass consists of $SiO_2$ and therefore is not etched by the chlorine-based gas.

A method of selectively forming a film on a silicon surface of a substrate having the silicon surface and an insulator surface by using the CVD apparatus having the above arrangement will be described below. The load locking mechanism described above is provided in this apparatus and exhausts the residual gas in the reaction chamber to reduce the pressure to be $2 \times 10^{-6}$ Torr or less even when the wafer 20 is heated. A source gas supplied from the hole 28 is a gas containing chlorine, and the apparatus can be used at a high temperature even within a pressure range in which the flow of the source gas becomes a molecular flow. In order to prevent entrance of the source gas, a purge gas having a higher pressure than that of the source gas is supplied from the hole 27.

Figure 3A:
FIGS. 3A, 3B and 3C are sectional views showing a method of forming a titanium silicide film on a hole bottom according to the present invention.

Upon film deposition, an Si (100) wafer 20 was used as a substrate. The Si wafer was thermally oxidized, and the resultant thermal oxide film was patterned by photolithography and wet etching (FIG. 3A). The resultant wafer was dipped in a dilute hydrofluoric acid to remove a native oxide film on the Si surface (represented by 51 in FIG. 3A), rinsed with water and dried, and then left to stand in air for a predetermined time interval. This wafer was loaded in the above CVD apparatus and heated up to about 720° C., and silane ($SiH_4$) gas as a source gas and titanium tetrachloride ($TiCl_4$) gas were simultaneously supplied to selectively deposit a titanium silicide ($TiSi_x$) film on only the Si surface. A supply flow rate of the $SiH_4$ gas was 10 SCCM and its pressure was 1 mTorr, and the pressure of the $TiCl_4$ gas was 5 to $10 \times 10^{-6}$ Torr. During a deposition time of about one minute, nuclei or a film having a height of 200 to 300 Å was deposited.

As a result, it is found that the length of the time period in which the wafer treated by dilute hydrofluoric acid is left to stand in air has a large effect on the nuclear density of deposited titanium silicide. That is, when the wafer is left to stand in air for a long time period and a hydrophilic property on the Si surface is weakened or lost, the nuclear density is very low, i.e., only one nucleus can be deposited in a square region having a side of several $\mu m$ to several tens of $\mu m$. When the wafer is left to stand in air for only several minutes and the hydrophilic property on the Si surface is strong, the nuclear density is very high, i.e., one nucleus is deposited in a square region having a side of 0.1 to less than 1 $\mu m$.

Figure 3B:
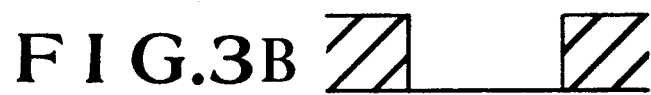
Figure 3C:

The wafer left to stand in air for several minutes after the dilute hydrofluoric acid treatment was loaded in the above CVD apparatus. Before titanium silicide was deposited, the wafer was heated up to about 720° C., and only an SiH₄ gas was supplied to the reaction chamber, thereby reducing and removing the native oxide film deposited on the Si surface after the dilute hydrofluoric acid treatment by using a reducing effect of the SiH₄ gas with respect to the native oxide film (FIG. 3B). Subsequently, the above deposition step not performing the reduction treatment of the native oxide film by using the SiH₄ gas was performed, i.e., Si₄ gas and TiCl₄ gas were simultaneously supplied as source gases to selectively deposit a titanium silicide film on only the Si surface (FIG. 3C). After the reduction treatment of the native oxide film was performed by using the SiH₄ gas, the titanium silicide film was selectively deposited.

The nuclear density of titanium silicide deposited by the method according to this embodiment was higher than that obtained when the reduction treatment of the native oxide film by using the SiH₄ gas was not performed. By comparing the results obtained when the reduction treatment using the SiH₄ was performed and not performed, it is found that slight oxidation or contamination on the Si surface produced after the dilute hydrofluoric acid adversely affects the deposition nuclear density of titanium silicide.

A second experiment using an Si wafer having a surface condition different from that of the Si wafer used in the above first experiment will be described.

An Si (100) wafer was thermally oxidized, and the resultant thermal oxide film was patterned by photolithography and dry etching. The wafer was dipped in dilute hydrofluoric acid to remove a native oxide film from the Si surface, rinsed with water and dried, and left to stand in air for a predetermined time period. When the wafer was dipped in the dilute hydrofluoric acid to remove the native oxide film from the Si surface, a hydrophilic property of the Si surface could be clearly confirmed. After the wafer was rinsed, however, the hydrophilic property was perfectly lost. This wafer was used to selectively deposit a titanium silicide film under the same conditions as in the first experiment.

As a result, regardless of the time length in which the wafer was left to stand in air after the dilute hydrofluoric acid treatment, the nuclear density was very low, i.e., about only one nucleus was deposited in a square region having a side of several tens of μm. When the wafer left to stand in air for several minutes after the dilute hydrofluoric acid treatment was reduced by the same method as the reduction treatment of the native oxide film using the SiH₄ gas described above and then a titanium silicide film was selectively deposited, about one nucleus was densely deposited in a square region having a side of less than 1 μm. In addition, even a native oxide film formed on a wafer left to stand in air for several hours after the dilute hydrofluoric acid treatment could be reduced by the SiH₄ gas. When a titanium silicide film was selectively deposited on this wafer, about one nucleus was deposited in a square region having a side of less than 1 μm.

It is well known that when an Si substrate is heated up to a high temperature below 820° C. in a very high vacuum, a native oxide film on the Si surface is evaporated to form a clean Si surface. The effect of the present invention, however, is obviously not to be derived from this high-temperature heating effect from the following experiment. That is, a wafer treated by using dilute hydrofluoric acid following the same procedures as in the second experiment was rinsed with water and dried, left to stand in air for several minutes, and then heated in the reaction chamber without supplying a source gas up to the same temperature as that upon native oxide film reduction over a time period three times or more that required for reducing a native oxide film by using the SiH₄ gas. Thereafter, SiH₄ gas and TiCl₄ gas were substantially simultaneously supplied to deposit titanium silicide. In this case, the nuclear density was not so increased but was substantially the same as that obtained when the heating time was short. This result indicates that reduction of the native oxide film was not performed when the wafer was heated in vacuum.

It is well known that the reduction effect of the SiH₄ gas occurs well at a high temperature of 900° C. or more. However, the reduction effect of the SiH₄ gas in the low temperature below about 800° C. had not been known until our experiment was done. By the experiment mentioned above, it is clarified that the effect occurs at about 700° C. to 750° C. The fact that the SiH₄ gas reduces the native oxide film can be confirmed since Si nuclei are epitaxially grown on the Si surface with good crystallinity when the SiH₄ gas is continuously supplied. If the native oxide film remains on the Si surface, it is expected that Si nuclei are not epitaxially grown with good crystallinity but a twin crystal or polycrystalline Si is formed. Such a reduction effect of SiH₄ gas with respect to a native oxide film at a low temperature is also suggested by Murota et al. on the basis of different experiment of Si epitaxial growth obtained in an ultra clean atmosphere by using a hot wall type CVD apparatus ("Electronic Data Communication Society Technical Research Report", Vol. 88, No. 162, pp. 9 to 13, 1988 (SDM88-3) and "Applied Physics Letters", Vol. 54, No. 11, (1989) 1007). On the basis of the above experiment of selective growth of a titanium silicide film and selective epitaxial growth of Si, the present inventors had confidence that SiH₄ gas had a reduction effect on a native oxide film at a low temperature.

An end timing of reduction of the native oxide film performed by the SiH₄ gas was determined by emitting an He-Ne laser beam on the Si surface of the wafer through a glass window formed in the wall of the reaction chamber and detecting scattered light of the laser light generated when epitaxial growth of Si is started. This scattered light gradually appears when an offset time of several tens of seconds to several minutes elapses after the SiH₄ gas is supplied to the reaction chamber. It is assumed that reduction of the native oxide film is performed in this offset time. Si nucleation occurs either significantly or insignificantly in accordance with the orientation of a wafer. When a (100) substrate is used as in this experiment, deposition significantly occurs. In this case, since a deposition rate on a surface oblique with respect to the substrate surface is high, a substantially perfectly flat film is obtained if deposition is continued. This state of film deposition indicates that an Si film is epitaxially grown with good crystallinity. Even when the Si film is in the form of nuclei in an initial stage of deposition, it is confirmed by analysis performed by electron diffraction that the Si film is epitaxially grown with good crystallinity without forming a twin crystal or polycrystal.

As described above, it is found that the nuclear density in the initial stage of film deposition is largely adversely affected by the cleanness on the Si surface in selective CVD of titanium silicide. In the initial stage of film deposition, if the nuclear density of titanium silicide is low, a thin dense film cannot be deposited. Even if a thick film is formed, the formed film has large undulations. If the native oxide film on the Si surface is too thick or extremely contaminated, it is difficult to even selectively deposit a titanium silicide film.

Such an influence of surface cleanness in the selective CVD method is also found in an aluminum selective CVD method (Japanese Patent Laid-Open No. 63-33569) using tributylaluminum gas or a tungsten selective CVD method.

The experiment in which a small difference between cleanness of Si surfaces is found to largely, adversely affect nuclear density upon initial film deposition has been described together with the embodiment of the present invention. The present invention, however, is not limited to the above embodiment. The native oxide film reducing/removing effect of the $SiH_4$ gas has a wide range with respect to a supply flow rate or a pressure of the $SiH_4$ gas and a substrate temperature. This range is assumed to be substantially the same as a range of a flow rate, a pressure, and a substrate temperature capable of epitaxially growing Si on an Si surface with a native oxide film by the $SiH_4$ gas. The similar result can be obtained by using disilane ($Si_2H_6$) gas instead of the $SiH_4$ gas. In order to selectively deposit a titanium silicide film as in the above embodiment, a substrate temperature for reducing and removing a native oxide film by using the $SiH_4$ gas can be the same as a substrate temperature for depositing titanium silicide. In addition, a flow rate and a pressure of the $SiH_4$ gas can be the same as those for growing titanium silicide. In this case, therefore, immediately after the end of reduction of a native oxide film is detected by maintaining a substrate temperature and a flow rate and a pressure of the $SiH_4$ gas constant, $TiCl_4$ gas can be supplied to deposit a titanium silicide film. When a lamp heater and the like having a short temperature change time constant is used as a heating system for a wafer, even if a temperature upon reduction of a native oxide film using the $SiH_4$ gas differs from a substrate temperature upon selective deposition of a film thereafter, the substrate temperature can be rapidly changed. Therefore, a film can be deposited with minimum oxidation on the Si surface or minimum contamination.

Figure 5:
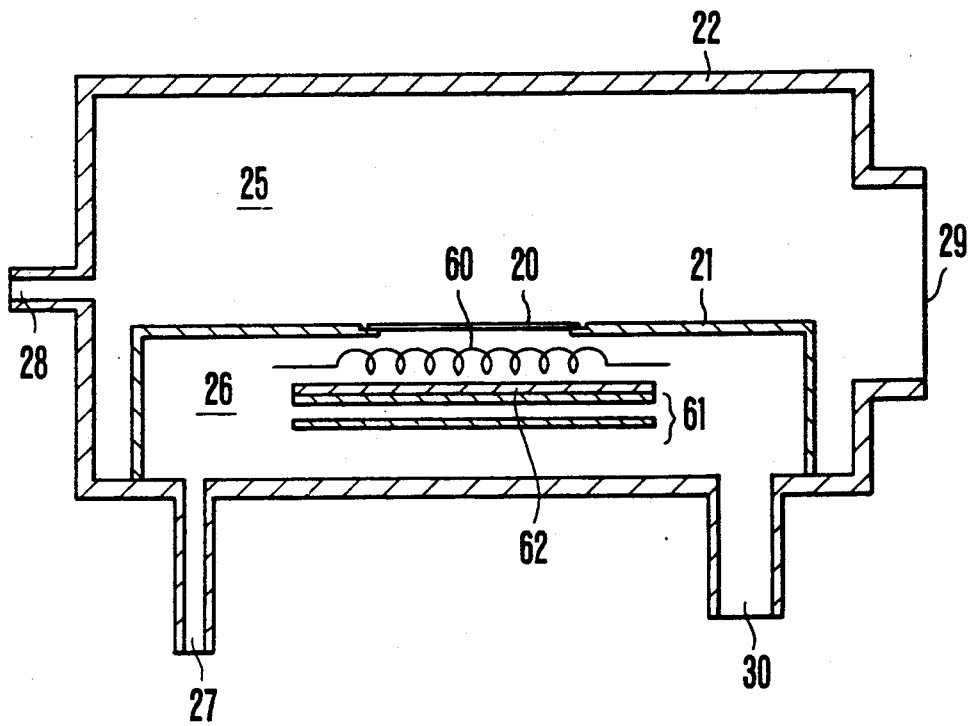
FIG. 5 is a sectional view showing a basic arrangement of another embodiment of a CVD apparatus to which the selective CVD method according to the present invention is applied.
Figure 9:
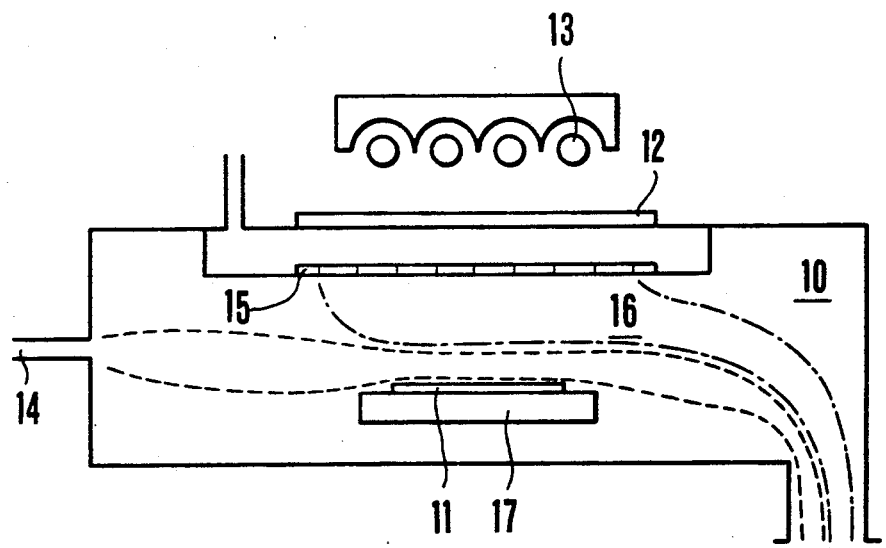
FIG. 9 is a sectional view showing an arrangement of a conventional CVD apparatus.

Another arrangement of a CVD apparatus according to another aspect of the present invention is shown in FIG. 5. In FIG. 5, the same reference numerals as in FIG. 1 denote the same parts and a detailed description thereof will be omitted. This arrangement differs from that of the first embodiment in that neither the window 24 nor the lamp heater 23 are used and a heater (heating member) 60 and a heat reflecting plate 61 are provided in a region 26 instead. The heater 60 is held by an insulator 62 and the like. Radiant light from the heater 60 directly reaches and heats the rear surface of a wafer 20. The heat reflecting plate 61 reflects or re-radiates the radiant light from the heater 60, thereby preventing overheating of a wall of a reaction chamber or the like.

Examples of a suitable material of the heater 60 are tantalum (Ta) and tungsten (W). A wire consisting of such a material is densely wound to form a coil, thereby increasing the surface area to increase an amount of the radiant light. Refractory metals such as molybdenum (Mo), tantalum (Ta), and tungsten (W) are suitable for a material of the heat reflecting plate 61. Although any refractory insulator can be used as the insulator 62, quartz glass can also be used, provided that the temperature of the heater 60 is not increased too high. For example, when Ta, Mo, and quartz glass are used as the heater 60, the heat reflecting plate 61, and the insulator 62, respectively, the Si wafer 20 can be heated up to about 1,000° C.

If the arrangement shown in FIG. 5 is designed such that a high voltage is applied to the heater 60 to generate heat, the heater 60 can be easily destroyed by discharge when the region 26 of the reaction chamber 22 is filled with a purge gas. In this case, therefore, the pressure of the purge gas may not be increased too high.

A main difference between the CVD apparatuses according to the above first and second embodiments is that wavelength distributions of the radiant light of the heaters are different from each other. That is, in the first embodiment using the lamp heater 23, an amount of a visible component can be increased since the temperature of the heating member can be increased. In the second embodiment using the coil heater 60 or the like, however, since almost no cooling effect is obtained by the purge gas, a failure easily occurs due to local overheating of the insulator 62 or the like. Therefore, the brightness of the heating member cannot be much increased, i.e., the heating member is used with a large amount of infrared components. This difference is increased when an Si wafer which well transmits infrared light having a long wavelength is used as the wafer 20. That is, in the second embodiment, an amount of infrared light transmitted through the Si wafer is increased. When a metal film is deposited on the surface of the Si wafer, this infrared light is absorbed by the metal film to increase the temperature of the film. Therefore, in order to maintain the temperature of the surface of the metal film constant during deposition, the apparatus according to the first embodiment can be easily controlled.

In each of the embodiments shown in FIGS. 1 and 5, the surface of the wafer 20 (i.e., the surface to be exposed to a source gas) faces up. The surface of the wafer, however, may face down by arranging the heater or the susceptor upside down. In this case, the heater or the susceptor is held, and the wafer is urged against the susceptor 21 by, e.g., the wafer holder 40 as shown in FIG. 3. A wafer holding portion can be slightly modified to set a wafer upright so that the surface of the wafer faces sideways.

A method of precisely controlling the resistance of a titanium silicide film and the consumption amount of underlying silicon upon deposition of the titanium silicide film will be described below. As will be described in detail in the following embodiment, it is found that suppression of the consumption amount of underlying silicon can be achieved by extremely decreasing a ratio of the flow rate of titanium tetrachloride gas to the flow rate of silane gas to be supplied to the reaction chamber as compared with a flow rate ratio of a plurality of source gases used in another CVD.

Figure 6:
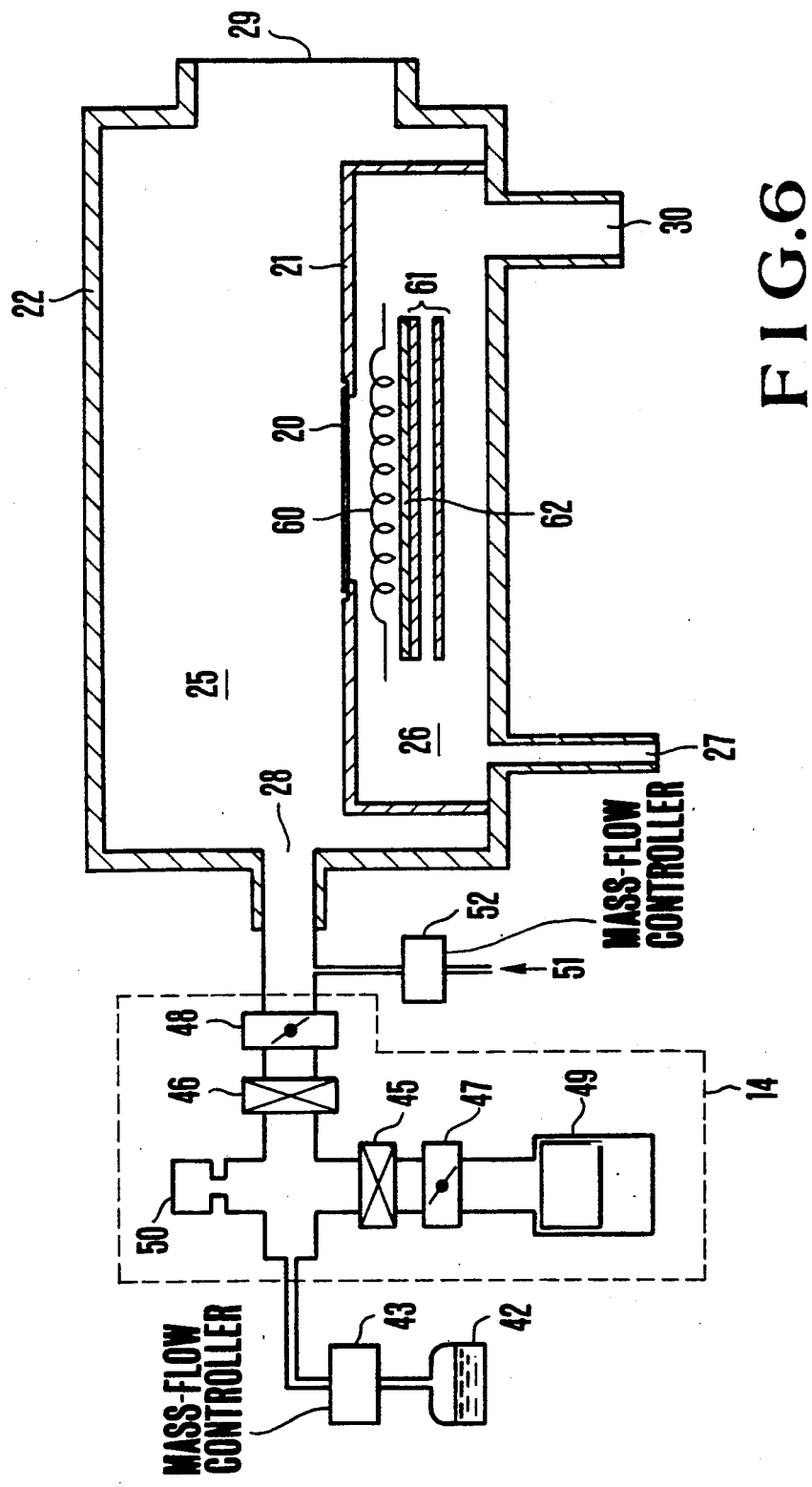
FIG. 6 is a sectional view showing a modification of the CVD apparatus shown in FIG. 4 including a titanium tetrachloride gas fine-flow control mechanism.

In this embodiment, a CVD apparatus shown in FIG. 6 is used. This apparatus is obtained by adding a titanium tetrachloride gas fine-flow control mechanism to the CVD apparatus shown in FIG. 5. In FIG. 6, the same reference numerals as in FIG. 5 denotes the same parts and a detailed description thereof will be omitted.

Referring to FIG. 6, reference numeral 42 denotes a tank containing liquid titanium tetrachloride; 43, a mass-flow controller connected to the tank; 44, a fine-flow controller arranged between the output side of the mass-flow controller 43 and a source gas inlet port 28 of a reaction chamber 22. The fine-flow controller 44 is constituted by valves 45 and 46, conductance valves 47 and 48, a vacuum exhaust pump 49, and a pressure gage 50.

In this arrangement, titanium tetrachloride gas evaporated from the liquid titanium tetrachloride 12 is supplied to the fine-flow controller 44 while its flow rate is controlled by the mass-flow controller 43. The fine-flow controller 44 adjusts the flow rate of the titanium tetrachloride gas by setting the open degree (conductance) of the conductance valves 47 and 48. When the titanium tetrachloride gas is supplied, the valve 45 is constantly open to maintain the pressure of the titanium tetrachloride gas measured by the pressure gage 50 constant. Supply of the titanium tetrachloride gas to the reaction chamber 22 is started or stopped by opening/closing the valve 48. As the vacuum exhaust pump 49, a pump capable of performing high vacuum exhaustion such as a turbo molecular pump is suitable. By providing such a gas flow control mechanism, the titanium tetrachloride gas at a very low flow rate can be supplied.

Since the flow rate of silane gas 51 is comparatively high, the flow rate can be controlled by the generally used mass-flow controller 52.

The above CVD apparatus was used to control the very low flow rate of the titanium tetrachloride gas, thereby depositing a titanium silicide film on the surface of a silicon wafer. As the silicon wafer, a monocrystalline wafer having an orientation of (100) and a window formed in a thermal oxide film by wet etching was used. The same result was obtained by a wafer having an orientation of (111). That is, orientation dependency of silicon is low with respect to titanium silicide film deposition. Prior to deposition of a titanium silicide film, the silicon wafer was dipped in a dilute hydrofluoric acid to remove a native oxide film on the surface. The resultant wafer was set on a wafer susceptor in the reaction chamber 22 by a load locking mechanism and heated up to 650° C. to 720° C., and only silane gas was supplied at 10 SCCM and 1 mTorr, thereby cleaning the silicon surface. A time period required for this cleaning was 10 seconds to 4 minutes. Subsequently, without changing the wafer temperature, titanium tetrachloride gas was supplied at 0.05 to 0.3 SCCM and 2 to $13 \times 10^{-5}$ Torr, and silane gas was supplied at 50 SCCM and 2 mTorr, thereby depositing the titanium silicide film to have a thickness of 600 to 1,200 Å for about five minutes. The flow rate of the titanium tetrachloride gas supplied to the reaction chamber was obtained by extrapolation by using a known flow rate and a known pressure assuming that the flow rate is proportional to the pressure in the reaction chamber.

Figure 7:
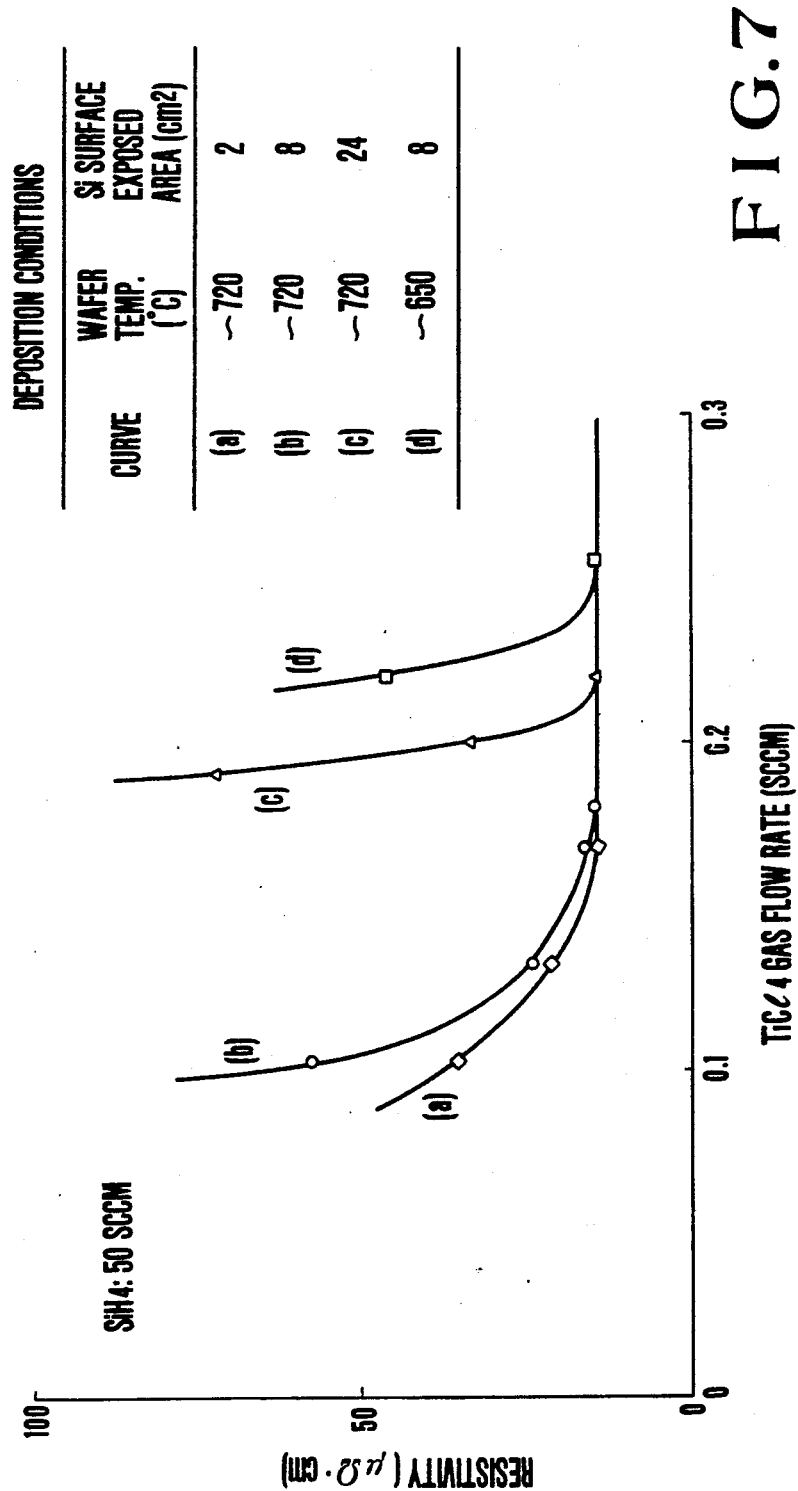
FIG. 7 is a graph showing a change in resistivity of a titanium silicide as a function of a flow rate of the titanium tetrachloride gas.
Figure 8:
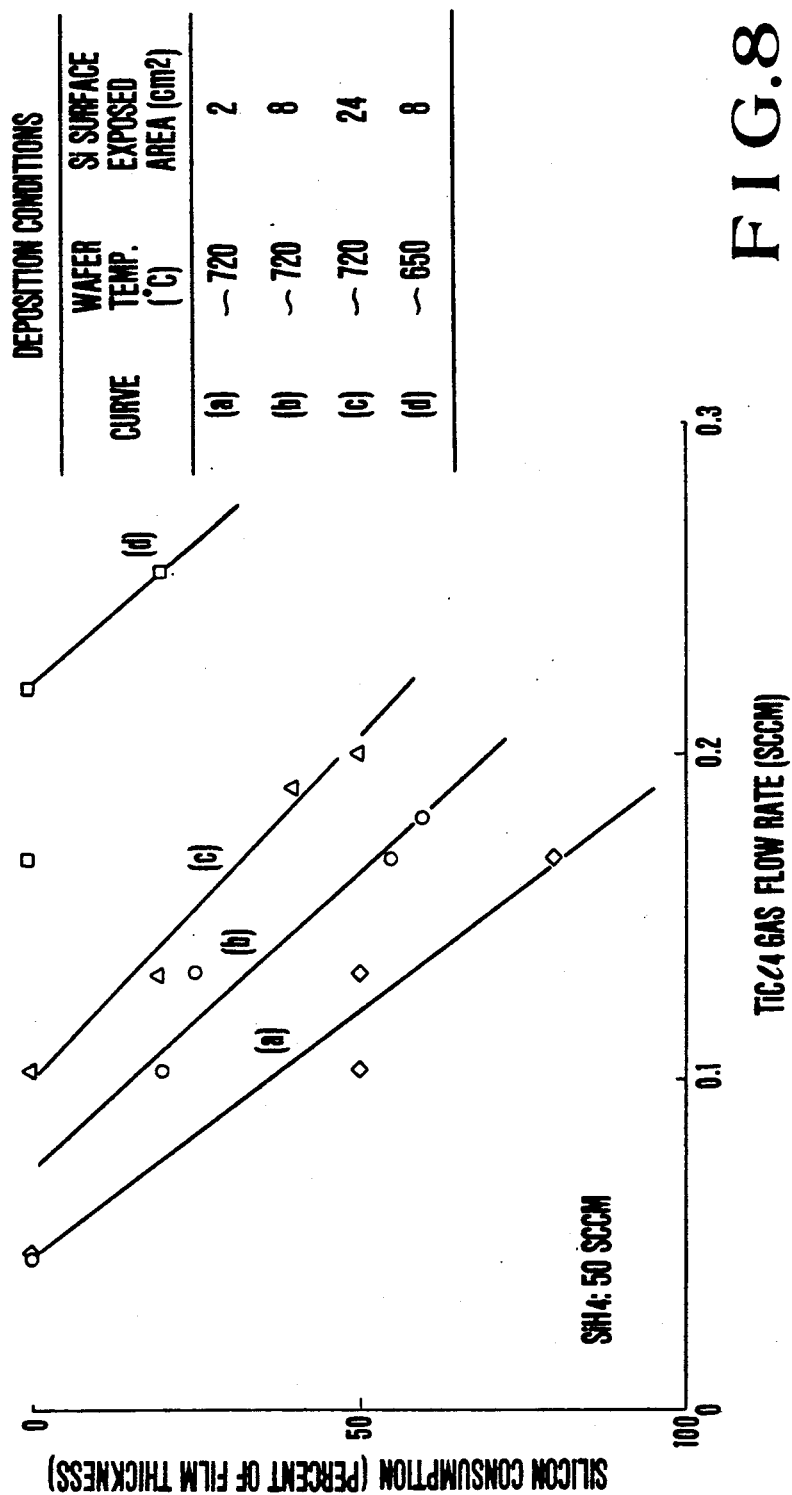
FIG. 8 is a graph showing a change in silicon consumption amount of titanium silicide film as a function of the flow rate of the titanium tetrachloride gas.

FIGS. 7 and 8 are graphs showing data of the titanium silicide film obtained by the above deposition conditions, i.e., the resistivity of the film (FIG. 7) and silicon consumption (the depth of titanium silicide/silicon interface after deposition of the titanium silicide film from the silicon surface before deposition represented by a percentage of a titanium silicide film thickness) (FIG. 8) as functions of the supply flow rate of the titanium tetrachloride gas. The resistivity of the titanium silicide film was obtained by a four-point probe, and the silicon consumption was obtained by observing a section of a sample by using a scanning electron microscope.

Referring to FIG. 7, curves (a), (b), and (c) represent values obtained when silicon surface exposed areas were about 2, 8, and 24 cm², respectively, at the wafer temperature of about 720° C. When the flow rate of the titanium tetrachloride gas is decreased, the resistivity is abruptly increased. As the silicon surface exposed area is increased, a flow rate at which the resistivity is increased is increased. Such a resistivity change depending on the silicon surface exposed area indicates the presence of a loading effect. Curves (e), (f), and (g) in FIG. 8 represent silicon consumptions corresponding to the curves (a), (b), and (c), respectively, shown in FIG. 7. As shown in FIG. 8, the loading effect is present in the silicon consumption as in the resistivity. FIGS. 7 and 8 indicate the fact that the flow rate of the titanium tetrachloride gas at which the resistivity of the titanium silicide film is low and the silicon consumption is small is a flow rate at which the resistivity starts increasing. In this case, the silicon consumption is about 50%.

Each of curves (d) and (h) in FIGS. 7 and 8, respectively, represents data obtained when the wafer temperature was about 650° C. and the silicon surface exposed area was about 8 cm². The data indicates that when the wafer temperature is low, the flow rate of the titanium tetrachloride gas must be increased in order to deposit a titanium silicide film having a low resistivity. In addition, the curves (d) and (h) in FIGS. 7 and 8, respectively, indicate that the silicon consumption obtained when the resistivity starts increasing is smaller (by about 20%) than that obtained when the wafer temperature is high. When the wafer temperature is at most about 650° C., the silicon surface can be cleaned by a silane gas. A time required for cleaning is several minutes although it tends to be longer than that at a high temperature. Even if the wafer temperature is low, a fine titanium silicide film having a low resistivity can be deposited by performing cleaning using silane gas.

In the above embodiments, the titanium silicide film was deposited on only the exposed portion of the silicon surface but is not deposited on an insulating film. An X-ray diffraction pattern of the deposited titanium silicide film is C54 type $TiSi_2$.

In the CVD apparatus of the present invention, even when the titanium silicide film was repeatedly deposited as in the above embodiments, almost no entrance of a source gas into the region 26 occurred. Therefore, neither blur on the window 24 nor insulation breakdown of the heater 60 occurred. In addition, a titanium silicide films having substantially the same quality could be repeatedly manufactured under the same deposition conditions.

Note that in the above embodiments of the method of using the CVD apparatus according to the present invention, only deposition of a titanium silicide film has been described. The CVD apparatus of the present invention is not limited to the above embodiments but can be suitably used to form various types of a metal film or a metal silicide film by using gases of, e.g., molybdenum pentachloride ($MoCl_5$), tungsten hexachloride ($WCl_6$), and tantalum pentachloride ($TaCl_5$).

The effects of the above embodiments will be summarized below.

(1) In the selective CVD method used in the present invention, a silicon substrate loaded in a reaction chamber is heated to reduce and remove a native oxide film on the silicon surface by using a gas consisting of silicon hydride, and a source gas is subsequently supplied to the reaction chamber, thereby selectively depositing a film on only the silicon surface.

Therefore, when the present invention is applied to selectively deposit a thin metal film on a shallow junction of a semiconductor device, a uniform film having small undulations can be deposited with good selectivity. As a result, a high performance semiconductor device having a low contact resistance and a low junction leak current value can be manufactured. In addition, when the present invention is applied to bury a through hole having a high aspect ratio with a metal, a manufacturing yield can be increased since the hole can be uniformly buried.

(2) In the CVD apparatus used in the present invention, a reaction chamber is divided into two regions by a wafer susceptor having a wafer contact portion consisting of quartz glass and holding a wafer so that the wafer contact portion contacts with only a peripheral portion of the wafer, a purge gas is supplied to a first region at a wafer heating side of the divided reaction chamber, and an exhaust mechanism is connected when a source gas is supplied to a second region at an opposite position of the wafer heating side of the divided reaction chamber. Since a gap defined between the first and second regions divided by the wafer susceptor is minimized so that radiant light emitted from a heating member of a heating mechanism is directly absorbed by the wafer, CVD can be performed at a high temperature by using a chlorine-based gas having a strong adhesion property even in a pressure region in which a flow of the source gas becomes a molecular flow. In addition, since only a very small amount of source gas enters into a portion in which a window or a heater is installed, the portion is substantially not contaminated. Therefore, metal films having the same film quality can be repeatedly manufactured under the same deposition conditions. As a result, CVD capable of forming a high-quality metal film with high reproducibility can be performed.

What is claimed is:

1. A selective chemical vapor deposition method comprising the steps of:

arranging a substrate having a silicon surface and an insulator surface in a reaction chamber in which residual gas is exhausted to a first low pressure;

heating up said substrate to a temperature below 820° C.;

supplying a gas selected from the group consisting of silane gas and disilane gas in said reaction chamber at a second low pressure to reduce and remove a native oxide film on said silicon surface by said gas; and then supplying a source gas in said reaction chamber at a third low pressure to selectively form a metal film or a metallic film on only said silicon surface.

2. A method according to claim 1, wherein said gas is supplied onto said silicon surface heated to 650° C. to 750° C.

3. A method according to claim 1, wherein an end of reduction is determined by detecting scattered light of light radiated on said silicon surface.

4. A method according to claim 1, wherein
said source gas is a gas mixture of silane gas and titanium tetrachloride gas, and
said film selectively formed on only said silicon surface is a titanium silicide film.

5. A method according to claim 1, wherein said second low pressure of said silane gas or said disilane gas is in the order of mTorr.

6. A method according to claim 4, wherein a ratio of a flow rate of said titanium tetrachloride gas to a flow rate of said silane gas to be supplied to said reaction chamber is set to be an arbitrary very small value, thereby suppressing a consumption amount of underlying silicon to be a proper amount upon formation of said titanium silicide film.

7. A method according to claim 4, wherein said second low pressure of said silane gas is in the order of mTorr, and a pressure of said titanium tetrachloride gas is in the order of $10^{-6}$ to $10^{-4}$ Torr.

8. A method according to claim 6, wherein said ratio ranges from 0.001 to 0.006.

* * * * *